(12) United States Patent
Ruthe et al.

(10) Patent No.: US 9,372,078 B1
(45) Date of Patent: Jun. 21, 2016

(54) DETECTING THICKNESS VARIATION AND QUANTITATIVE DEPTH UTILIZING SCANNING ELECTRON MICROSCOPY WITH A SURFACE PROFILER

(71) Applicant: Western Digital (Fremont), LLC, Fremont, CA (US)

(72) Inventors: Kurt C. Ruthe, Bangkok (TH); Sean P. Leary, Saraburi (TH)

(73) Assignee: Western Digital (Fremont), LLC, Fremont, CA (US)

( * ) Notice: Subject to any disclaimer, the term of this patent is extended or adjusted under 35 U.S.C. 154(b) by 0 days.

(21) Appl. No.: 14/310,294

(22) Filed: Jun. 20, 2014

(51) Int. Cl.
*G01B 15/02* (2006.01)
*H01J 37/22* (2006.01)
*G06T 7/00* (2006.01)

(52) U.S. Cl.
CPC .............. *G01B 15/02* (2013.01); *G06T 7/0008* (2013.01); *H01J 37/222* (2013.01)

(58) Field of Classification Search
None
See application file for complete search history.

(56) References Cited

U.S. PATENT DOCUMENTS

| | | |
|---|---|---|
| 5,795,490 A | 8/1998 | Momose |
| 5,795,990 A | 8/1998 | Gitis et al. |
| 6,075,673 A | 6/2000 | Wilde et al. |
| 6,097,575 A | 8/2000 | Trang et al. |
| 6,125,014 A | 9/2000 | Riedlin, Jr. |
| 6,125,015 A | 9/2000 | Carlson et al. |
| 6,130,863 A | 10/2000 | Wang et al. |
| 6,137,656 A | 10/2000 | Levi et al. |
| 6,144,528 A | 11/2000 | Anaya-Dufresne et al. |
| 6,147,838 A | 11/2000 | Chang et al. |
| 6,151,196 A | 11/2000 | Carlson et al. |
| 6,178,064 B1 | 1/2001 | Chang et al. |
| 6,181,522 B1 | 1/2001 | Carlson |
| 6,181,673 B1 | 1/2001 | Wilde et al. |
| 6,229,672 B1 | 5/2001 | Lee et al. |
| 6,236,543 B1 | 5/2001 | Han et al. |
| 6,246,547 B1 | 6/2001 | Bozorgi et al. |
| 6,249,404 B1 | 6/2001 | Doundakov et al. |
| 6,268,919 B1 | 7/2001 | Meeks et al. |
| 6,313,647 B1 | 11/2001 | Feng et al. |
| 6,330,131 B1 | 12/2001 | Nepela et al. |
| 6,339,518 B1 | 1/2002 | Chang et al. |
| 6,349,017 B1 | 2/2002 | Schott |

(Continued)

OTHER PUBLICATIONS

Lifan Chen, et al., U.S. Appl. No. 13/460,501, filed Apr. 30, 2012, 12 pages.

(Continued)

*Primary Examiner* — Sumati Lefkowitz
*Assistant Examiner* — Jiangeng Sun

(57) ABSTRACT

A method and system to detect thickness variation of a subject material are described. In an aspect, tribological wear is assessed for a disk drive memory system at the pole tip region of a magnetic head. Images are obtained of a first region and a second region of a subject material utilizing scanning electron microscopy (SEM). The SEM images are image processed to obtain a differential contrast between the first region and the second region. An image intensity variation is determined between masked SEM images of the first region and the second region by obtaining a surface profiler image of the first region and the second region, and overlaying and calibrating the SEM images with the surface profiler images. In an aspect, image intensity variation is converted to quantified thickness utilizing a fitted relation obtained from the calibration of the surface profiler images with the SEM images.

10 Claims, 7 Drawing Sheets

(56) References Cited

U.S. PATENT DOCUMENTS

| | | |
|---|---|---|
| 6,373,660 B1 | 4/2002 | Lam et al. |
| 6,378,195 B1 | 4/2002 | Carlson |
| 6,418,776 B1 | 7/2002 | Gitis et al. |
| 6,459,280 B1 | 10/2002 | Bhushan et al. |
| 6,522,504 B1 | 2/2003 | Casey |
| 6,538,850 B1 | 3/2003 | Hadian et al. |
| 6,583,953 B1 | 6/2003 | Han et al. |
| 6,646,832 B2 | 11/2003 | Anaya-Dufresne et al. |
| 6,661,612 B1 | 12/2003 | Peng |
| 6,665,146 B2 | 12/2003 | Hawwa et al. |
| 6,690,545 B1 | 2/2004 | Chang et al. |
| 6,704,173 B1 | 3/2004 | Lam et al. |
| 6,708,389 B1 | 3/2004 | Carlson et al. |
| 6,717,773 B2 | 4/2004 | Hawwa et al. |
| 6,721,142 B1 | 4/2004 | Meyer et al. |
| 6,724,199 B1 | 4/2004 | Bhushan et al. |
| 6,744,599 B1 | 6/2004 | Peng et al. |
| 6,771,468 B1 | 8/2004 | Levi et al. |
| 6,796,018 B1 | 9/2004 | Thornton |
| 6,801,402 B1 | 10/2004 | Subrahmanyam et al. |
| 6,856,489 B2 | 2/2005 | Hawwa et al. |
| 6,873,496 B1 | 3/2005 | Sun et al. |
| 6,912,103 B1 | 6/2005 | Peng et al. |
| 6,937,439 B1 | 8/2005 | Chang et al. |
| 6,956,658 B2 | 10/2005 | Meeks et al. |
| 6,956,718 B1 | 10/2005 | Kulkarni et al. |
| 6,972,930 B1 | 12/2005 | Tang et al. |
| 7,006,330 B1 | 2/2006 | Subrahmanyam et al. |
| 7,006,331 B1 | 2/2006 | Subrahmanyam et al. |
| 7,010,847 B1 | 3/2006 | Hadian et al. |
| 7,019,945 B1 | 3/2006 | Peng et al. |
| 7,027,264 B1 | 4/2006 | Subrahmanyam et al. |
| 7,085,104 B1 | 8/2006 | Hadian et al. |
| 7,099,117 B1 | 8/2006 | Subrahmanyam et al. |
| 7,174,622 B2 | 2/2007 | Meyer et al. |
| 7,289,299 B1 | 10/2007 | Sun et al. |
| 7,307,816 B1 | 12/2007 | Thornton et al. |
| 7,315,435 B1 | 1/2008 | Pan |
| 7,315,436 B1 | 1/2008 | Sanchez |
| 7,350,400 B1 | 4/2008 | Chen |
| 7,414,814 B1 | 8/2008 | Pan |
| 7,436,631 B1 | 10/2008 | Fanslau, Jr. et al. |
| 7,449,690 B2 * | 11/2008 | Nishiyama et al. ........... 250/310 |
| 7,474,508 B1 | 1/2009 | Li et al. |
| 7,477,486 B1 | 1/2009 | Sun et al. |
| 7,593,190 B1 | 9/2009 | Thornton et al. |
| 7,595,204 B2 | 9/2009 | Price |
| 7,595,963 B1 | 9/2009 | Chen et al. |
| 7,608,468 B1 * | 10/2009 | Ghinovker et al. ............. 438/16 |
| 7,616,405 B2 | 11/2009 | Hu et al. |
| 7,638,767 B2 * | 12/2009 | Yamaguchi et al. .......... 250/311 |
| 7,729,089 B1 | 6/2010 | Hogan |
| 7,995,310 B1 | 8/2011 | Pan |
| 8,025,932 B2 | 9/2011 | Wolden et al. |
| 8,081,400 B1 | 12/2011 | Hu |
| 8,087,973 B1 | 1/2012 | Sladek et al. |
| 8,089,730 B1 | 1/2012 | Pan et al. |
| 8,097,846 B1 | 1/2012 | Anguelouch et al. |
| 8,164,760 B2 | 4/2012 | Willis |
| 8,164,858 B1 | 4/2012 | Moravec et al. |
| 8,199,437 B1 | 6/2012 | Sun et al. |
| 8,208,224 B1 | 6/2012 | Teo et al. |
| 8,218,268 B1 | 7/2012 | Pan |
| 8,222,599 B1 | 7/2012 | Chien |
| 8,240,545 B1 | 8/2012 | Wang et al. |
| 8,256,272 B1 | 9/2012 | Roajanasiri et al. |
| 8,295,012 B1 | 10/2012 | Tian et al. |
| 8,295,013 B1 | 10/2012 | Pan et al. |
| 8,295,014 B1 | 10/2012 | Teo et al. |
| 8,320,084 B1 | 11/2012 | Shum et al. |
| 8,325,446 B1 | 12/2012 | Liu et al. |
| 8,325,447 B1 | 12/2012 | Pan |
| 8,339,742 B1 | 12/2012 | Sladek et al. |
| 8,339,747 B1 | 12/2012 | Hales et al. |
| 8,339,748 B2 | 12/2012 | Shum et al. |
| 8,343,363 B1 | 1/2013 | Pakpum et al. |
| 8,345,519 B1 | 1/2013 | Pan |
| 8,418,353 B1 | 4/2013 | Moravec et al. |
| 8,441,896 B2 | 5/2013 | Wang et al. |
| 8,446,694 B1 | 5/2013 | Tian et al. |
| 8,456,643 B2 | 6/2013 | Prabhakaran et al. |
| 8,456,776 B1 | 6/2013 | Pan |
| 8,462,462 B1 | 6/2013 | Moravec et al. |
| 8,477,459 B1 | 7/2013 | Pan |
| 8,485,579 B2 | 7/2013 | Roajanasiri et al. |
| 8,488,279 B1 | 7/2013 | Pan et al. |
| 8,488,281 B1 | 7/2013 | Pan |
| 8,490,211 B1 | 7/2013 | Leary |
| 8,514,522 B1 | 8/2013 | Pan et al. |
| 8,533,936 B1 | 9/2013 | Puttichaem et al. |
| 8,545,164 B2 | 10/2013 | Choumwong et al. |
| 8,553,365 B1 | 10/2013 | Shapiro et al. |
| 8,587,901 B1 | 11/2013 | Puttichaem et al. |
| 8,593,764 B1 | 11/2013 | Tian et al. |
| 8,599,653 B1 | 12/2013 | Mallary et al. |
| 8,604,431 B2 * | 12/2013 | Murakawa et al. ........... 250/310 |
| 8,605,389 B1 | 12/2013 | Pan et al. |
| 8,611,050 B1 | 12/2013 | Moravec et al. |
| 8,611,052 B1 | 12/2013 | Pan et al. |
| 8,623,197 B1 | 1/2014 | Kobsiriphat et al. |
| 8,624,184 B1 | 1/2014 | Souza et al. |
| 8,665,566 B1 | 3/2014 | Pan et al. |
| 8,665,567 B2 | 3/2014 | Shum et al. |
| 8,665,677 B1 | 3/2014 | Panitchakan et al. |
| 8,665,690 B1 | 3/2014 | Moravec et al. |
| 8,693,144 B1 | 4/2014 | Pan et al. |
| 8,756,795 B1 | 6/2014 | Moravec et al. |
| 8,758,083 B1 | 6/2014 | Rudy et al. |
| 8,760,812 B1 | 6/2014 | Chen et al. |
| 8,770,463 B1 | 7/2014 | Puttichaem et al. |
| 8,773,664 B1 | 7/2014 | Wang et al. |
| 8,779,359 B2 * | 7/2014 | Ogiso et al. ................... 250/310 |
| 8,792,212 B1 | 7/2014 | Pan et al. |
| 8,792,213 B1 | 7/2014 | Vijay et al. |
| 8,797,691 B1 | 8/2014 | Tian et al. |
| 2012/0318976 A1 * | 12/2012 | Matsumoto et al. .......... 250/307 |
| 2013/0098139 A1 | 4/2013 | Adams, Jr. |
| 2013/0234021 A1 * | 9/2013 | Sohn et al. .................... 250/307 |
| 2013/0244541 A1 | 9/2013 | Yaemglin et al. |
| 2013/0293982 A1 | 11/2013 | Huber |
| 2014/0072903 A1 * | 3/2014 | Satake et al. ...................... 430/5 |

OTHER PUBLICATIONS

R.F. Egerton, "Electron Energy-Loss Spectroscopy in the Electron Microscope", Publication Date: Jul. 29, 2011, Publisher: Springer, 3rd ed., pp. 135-169.

* cited by examiner

Example Output of Analysis

Pre-processed SEM Image Bright Areas have Wear

SEM Mask of Wear

White and Black Points Show Detected Wear

Wearmap

Note: Wear is defined to be positive

| | % Wear | | Max Wear [nm] |
|---|---|---|---|
| | < 1nm | >=1nm | |
| S1 | 0.07 | 0.02 | 0.00 |
| S2 | 1.19 | 1.89 | 1.19 |
| P1 | 1.75 | 3.23 | 1.24 |
| LS | 13.43 | 52.31 | 1.56 |
| S3 | 7.16 | 53.99 | 1.52 |
| S4 | 3.94 | 17.27 | 1.49 |
| S5 | 0.05 | 0.05 | 0.00 |

US 9,372,078 B1

DETECTING THICKNESS VARIATION AND QUANTITATIVE DEPTH UTILIZING SCANNING ELECTRON MICROSCOPY WITH A SURFACE PROFILER

BACKGROUND

A scanning electron microscope (SEM) is used to generate high-resolution images of objects and to show spatial variations. A SEM uses a focused beam of high-energy electrons to generate a variety of signals at the surface of solid specimens. In applications, data are collected over a selected area of the surface of the sample, and a two-dimensional image is generated that displays spatial variations.

While a SEM is useful for a variety of applications, one application in which it is used is with magnetic storage systems to qualitatively and subjectively assess head-media interactions. Magnetic storage systems are utilized in a wide variety of devices in both stationary and mobile computing environments. Magnetic storage systems include hard disk drives (HDD), and solid state hybrid drives (SSHD) that combine features of a solid-state drive (SSD) and a hard disk drive (HDD). Examples of devices that incorporate magnetic storage systems include desktop computers, portable notebook computers, portable hard disk drives, servers, network attached storage, digital versatile disc (DVD) players, high definition television receivers, vehicle control systems, cellular or mobile telephones, television set top boxes, digital cameras, digital video cameras, video game consoles, and portable media players.

Hard disk drive performance demands and design needs have intensified. A hard disk drive typically includes a read head and a write head, generally a magnetic transducer which can sense and change magnetic fields stored on disks. The current demand for larger capacity in a smaller dimension is linked to the demand for ever increasing storage track density. The seek time is the time it takes the head assembly to travel to a disk track where data will be read or written. The time to access data can be improved by reducing seek time, which affects HDD performance. Reduced seek time and very close spacing between the heads and the disk surface make HDDs vulnerable to damage caused by head-media contact, which may cause data loss. While head-media contact can result in immediate head and media failure or data loss, repeated head-media contact can result in eventual head and media degradation, including diamond-like carbon (DLC) wear at the air bearing surface, depletion of media surface lubrication, and scratches to media surface, which can also result in head and media failure or data loss.

BRIEF DESCRIPTION OF THE DRAWINGS

The foregoing aspects and many of the attendant advantages described herein will become more readily appreciated by reference to the following detailed description, when taken in conjunction with the accompanying drawings, wherein.

DETAILED DESCRIPTION

Figure 1:
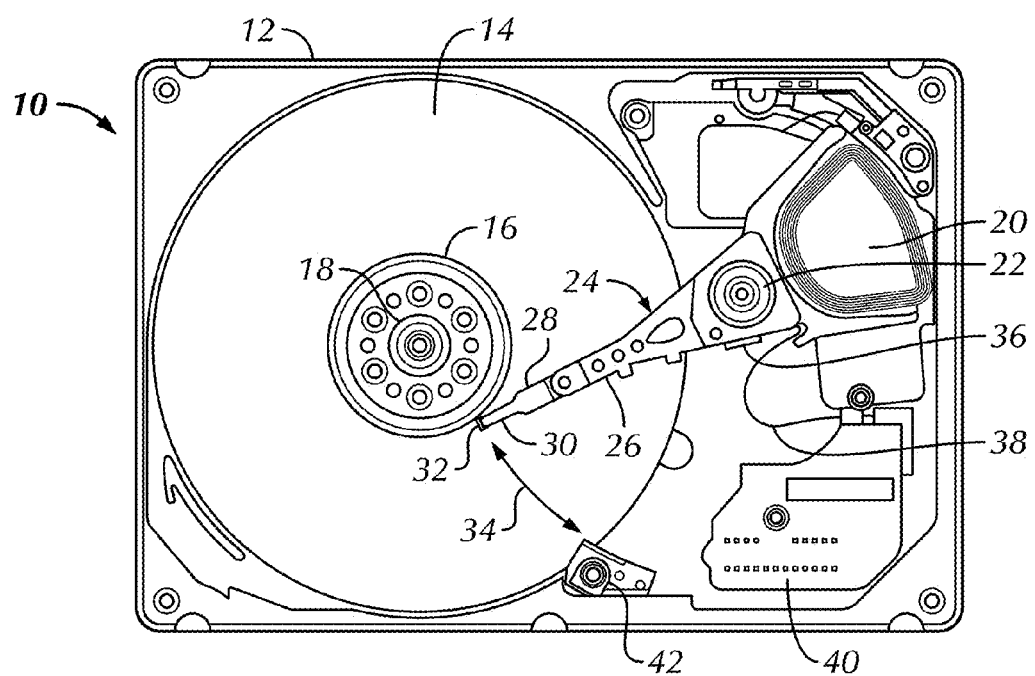
FIG. 1 is a top plan view of a disk drive data storage system in which embodiments are useful.

In the following description, numerous specific details are disclosed to provide a thorough understanding of embodiments of the method, system and apparatus. One skilled in the relevant art will recognize, however, that embodiments of the method, system and apparatus described herein may be practiced without one or more of the specific details, or with other electronic devices, methods, components, and materials, and that various changes and modifications can be made while remaining within the scope of the appended claims. In other instances, well-known electronic devices, components, structures, materials, operations, methods, process steps and the like may not be shown or described in detail to avoid obscuring aspects of the embodiments. Embodiments of the apparatus, method and system are described herein with reference to figures.

Reference throughout this specification to "one embodiment," "an embodiment," or similar language means that a particular feature, structure, electronic device, method or characteristic described in connection with the embodiment is included in at least one embodiment. Thus, appearances of the phrases "in one embodiment," "in an embodiment," and similar language throughout this specification may refer to separate embodiments or may all refer to the same embodiment. Furthermore, the described features, structures, methods, electronic devices, or characteristics may be combined in any suitable manner in one or more embodiments.

The interaction of an electron beam with matter in an electron microscope generates a multitude of signals which can be used to characterize physical and chemical properties of a sample under analysis. Of these signals, two primary signals are secondary and backscattered electrons. While secondary electrons are more sensitive to surface topography variation and provide contrast correspondent thereof, backscattered electrons are sensitive to material properties at the atomic scale and therefor provide material contrast.

The variation of backscattered electron yield as a function of atomic number may be obtained from scientific references. The backscattered electron contrast between two regions is described by the following equation, where $\epsilon_{BS}$ is the efficiency with which backscattered electrons are detected and $\eta$ is the backscatter coefficient of the materials.

$$C = \frac{\eta_2 - \eta_1}{\eta_2} = \frac{s_2 - s_1}{s_2} = \frac{\epsilon_{BS2}\eta_2 - \epsilon_{BS1}\eta_1}{\epsilon_{BS2}\eta_2}$$

A Monte Carlo simulation of the backscatter coefficient for a carbon thin film on a NiFe substrate for various carbon film thicknesses shows that as carbon thickness decreases, the backscatter coefficient increases. As an example, the following is observed: for a 10 nm carbon thickness the backscatter coefficient is 0.075, for a 8 nm carbon thickness the backscatter coefficient is 0.093, for a 6 nm carbon thickness the backscatter coefficient is 0.0126, for a 4 nm carbon thickness the backscatter coefficient is 0.181, for a 2 nm carbon thickness the backscatter coefficient is 0.245, for a 1 nm carbon thickness the backscatter coefficient is 0.272, and for a 0 nm carbon thickness the backscatter coefficient is 0.03. From the Monte Carlo simulation, it can be derived that the electron backscatter coefficient varies nearly linearly over a large range of carbon thicknesses for carbon on a NiFe substrate. The backscatter coefficient varies nearly linearly especially in the 1-2 nm thickness regime, for example, for carbon on a NiFe substrate as used in magnetic recording head overcoats.

Scanning electron microscopy may be used to assess surfaces of magnetic storage systems including hard disk drives (HDD), and solid state hybrid drives (SSHD). It has been used with magnetic storage systems to qualitatively and subjectively assess head-media interactions, such as wear and lubricant pickup.

Thermo-mechanical interaction of a magnetic recording head or slider, with media or a disk, fundamentally affects hard disk drive (HDD) performance and reliability. A diamond-like carbon (DLC) overcoat is used as a protective layer for head-media interaction, and also provides a corrosion barrier for the head. The magnetic head includes a shield comprised of a nickel iron alloy that is susceptible to corrosion. The integrity of the DLC is thus critical to HDD performance and reliability. Tribological testing at the component level is used to obtain an early understanding of these interactions and predictions of performance in drives.

A scanning electron microscope is conventionally used for qualitative assessment of wear. Wear can be quantitatively measured by atomic force microscopy (AFM) as a separate measurement, but because an electron microscope deposits carbon contamination on an imaged surface, an AFM measurement must be performed prior to electron microscope imaging, thus adding another step. Atomic force microscope wear measurements, with sufficient resolution to map the wear characteristics, are impractical for at least one reason in that the associated scan times become so long that thermal and mechanical image drift limit measurement precision. AFM is also significantly sensitive to pre-existing topography, which causes ambiguity when distinguishing wear. In conventionally used assessment methods, measurement of wear requires measurements before and after being subjected to wear conditions. Some embodiments described herein provide quantitative wear assessment without conventionally needed characterization overhead or cycle-time.

An apparatus, system and method are described herein for detecting thickness variation of a subject material from a scanning electron microscope (SEM) image and another surface profiler image. An embodiment further provides a quantitative depth and area assessment, and in an example application the quantitative depth assessment is provided at a sub-nanometer scale. In an embodiment, the apparatus, system and methods may be utilized to detect thickness variation of a subject material, and quantitative depth and area assessment for numerous applications in fields that would benefit from an objective thickness and area assessment of a subject material. Applications include, among other things, cutting and machining tools. One application, of many applications, in which quantitative depth and area assessment of a subject material is useful in determining tribological wear in the case of a disk drive memory system, or other memory systems utilizing a magnetic reading device, including a HDD and a SSHD. An embodiment provides a two-dimensional quantitative depth assessment of tribological wear of a magnetic head or media. An embodiment provides quantitative depth and area assessment of tribological wear of a magnetic head at the pole tip region of the magnetic head.

Referring to the figures wherein identical reference numerals denote the same elements throughout the various views, FIG. 1 illustrates a disk drive storage system 10, in which embodiments are useful. Features of the discussion and claims are not limited to this particular design, which is shown only for purposes of the example. Disk drive 10 includes base plate 12 that may be disposed on a top cover forming a sealed environment to protect internal components from contamination.

Disk drive 10 further includes one or more data storage disks 14 of magnetic computer-readable data storage media. The disks are generally formed of two main substances, namely, a substrate material that gives it structure and rigidity, and a magnetic media coating that holds the magnetic impulses or moments that represent data. Typically, both of the major surfaces of each data storage disk 14 include a plurality of concentrically disposed tracks for data storage purposes. Each data storage disk 14 is mounted on a hub or spindle 16, which in turn is rotatably interconnected with a base plate 12 and/or cover. Multiple data storage disks 14 are typically mounted in vertically spaced and parallel relation on the spindle 16. A spindle motor 18 rotates the data storage disks 14 at an appropriate rate. Perpendicular magnetic recording (PMR) involves recorded bits that are stored in a generally planar recording layer in a generally perpendicular or out-of-plane orientation. A PMR read head and a PMR write head are usually formed as an integrated read/write head on an air-bearing slider.

The disk drive 10 also includes an actuator arm assembly 24 that pivots about a pivot bearing 22, which in turn is rotatably supported by the base plate 12 and/or cover. The actuator arm assembly 24 includes one or more individual rigid actuator arms 26 that extend out from near the pivot bearing 22. Multiple actuator arms 26 are typically disposed in vertically spaced relation, with one actuator arm 26 being provided for each major data storage surface of each data storage disk 14 of the disk drive 10. Other types of actuator arm assembly configurations may be utilized as well, such as an assembly having one or more rigid actuator arm tips or the like that cantilever from a common structure. Movement of the actuator arm assembly 24 is provided by an actuator arm drive assembly, such as a voice coil motor 20 or the like. The voice coil motor (VCM) 20 is a magnetic assembly that controls the operation of the actuator arm assembly 24 under the direction of control electronics 40.

A suspension 28 is attached to the free end of each actuator arm 26 and cantilevers therefrom. The slider 30 is disposed at or near the free end of each suspension 28. What is commonly referred to as the read/write head (e.g., transducer) is mounted as a head unit 32 under the slider 30 and is used in disk drive read/write operations. As the suspension 28 moves, the slider 30 moves along arc path 34 and across the corresponding data storage disk 14 to position the head unit 32 at a selected position on the data storage disk 14 for the disk drive read/write operations. When the disk drive 10 is not in operation, the actuator arm assembly 24 may be pivoted to a parked position utilizing ramp assembly 42. The head unit 32 is connected to a preamplifier 36 via head wires routed along the actuator arm 26, which is interconnected with the control electronics 40 of the disk drive 10 by a flex cable 38 that is typically mounted on the actuator arm assembly 24. Signals are exchanged between the head unit 32 and its corresponding data storage disk 14 for disk drive read/write operations.

The data storage disks 14 comprise a plurality of embedded servo sectors each comprising coarse head position information, such as a track address, and fine head position information, such as servo bursts. As the head 32 passes over each servo sector, a read/write channel processes the read signal emanating from the head to demodulate the position information. The control circuitry processes the position information to generate a control signal applied to the VCM 20. The VCM 20 rotates the actuator arm 26 in order to position the head over a target track during the seek operation, and maintains the head over the target track during a tracking operation.

The head unit 32 may utilize various types of read sensor technologies such as anisotropic magnetoresistive (AMR), giant magnetoresistive (GMR), tunneling magnetoresistive (TMR), other magnetoresistive technologies, or other suitable technologies.

Magnetic recording is a near-field process in which reading and writing by the read/write head occur in close proximity to the disk surface. While head-media contact can result in immediate head and media failure or data loss, repeated head-media contact can result in eventual head and media degradation, including diamond-like carbon (DLC) wear at the air bearing surface, depletion of media surface lubrication, and scratches to media surface, which can also result in head and media failure or data loss.

Figure 2:
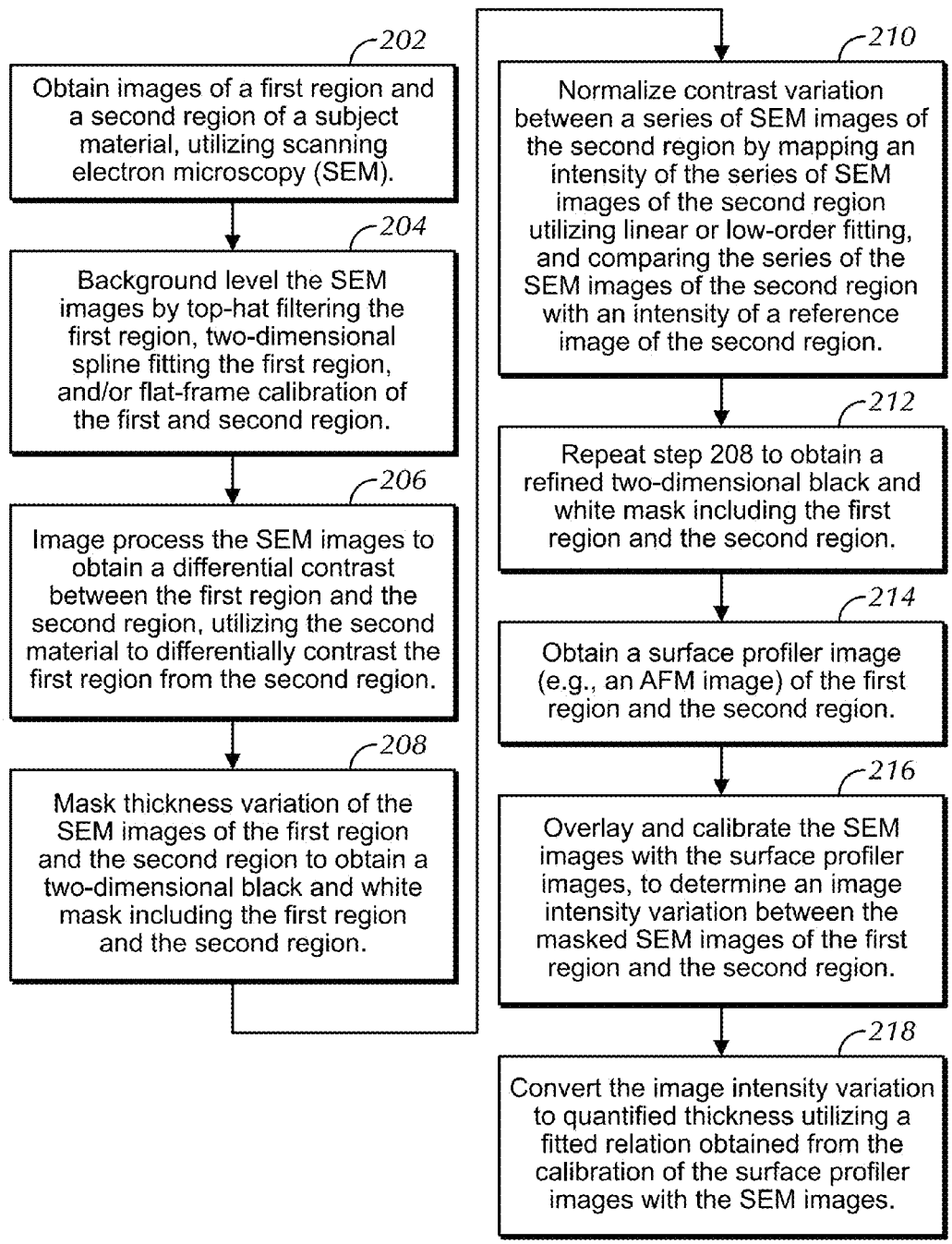
FIG. 2 is a flow diagram illustrating a method or process for detecting thickness variation of a subject material, in an embodiment, and further quantifying thickness depth in another embodiment, as can be used in a data storage system as in FIG. 1, in an embodiment.

FIG. 2 illustrates a method and process for detecting thickness variation of a subject material, in an embodiment, and further quantifying thickness depth in another embodiment. Numerous materials may be used as the subject material. In one application, the subject material is a surface from a data storage device, including a portion of a magnetic read head overcoat and/or write head overcoat, or a surface of a data storage disk facing an air bearing surface. In an embodiment, the differential contrast is due to differential tribological wear between a first region and a second region of the magnetic read head overcoat and/or write head overcoat. The overcoat may be diamond-like carbon.

In an embodiment, each step in the flowchart illustration can be implemented by computer program instructions. These computer program instructions may be provided to a processor of a programmable data processing apparatus, such that the instructions execute via the processor to implement the functions or actions specified in the flowchart.

As detailed in step 202, images are obtained of a first region of a subject material and a second region of a subject material, utilizing scanning electron microscopy (SEM). In an embodiment, other electron microscope types may be utilized including but not limited to transmission electron microscope, reflection electron microscope, and scanning transmission electron microscope. The first region is for example a region having wear (e.g., an air bearing surface or open-field alumina), and the second region is for example a region not having wear (e.g., a HDD shield). At least some areas of the first region are less thick than the second region, and the subject material is overlying a second material. In an example embodiment, the first region of the subject material is a HDD DLC overcoat with wear. Underlying the DLC overcoat is a metal (the second material). When the DLC overcoat has wear, the SEM image is brighter at the wear area due a stronger intensity of the underlying metal. In an alternative embodiment, the HDD subject material is assessed for lubricant pickup. Some embodiments of the methods described herein may determine whether the first region is thicker (rather than less thick) than the second region.

As stated in step 204, in an embodiment, background leveling is applied to the SEM images by top-hat filtering the first region, two-dimensional spline fitting the first region, and/or flat-frame calibration of the first and second region.

Next, as stated in step 206, by image processing the SEM images, a differential contrast is obtained between the first region and the second region. The image processing utilizes the second material to differentially contrast the first region from the second region.

As stated in step 208, in an embodiment, thickness variation of the SEM images of the first region and the second region is masked to obtain a two-dimensional black and white mask including the first region and the second region.

Next, as stated in step 210, in an embodiment, contrast variation between a series of SEM images of the second region is normalized by mapping an intensity of the series of SEM images of the second region utilizing linear or low-order fitting, and comparing the series of the SEM images of the second region with an intensity of a reference image of the second region. Contrast normalization may be used to remove or minimize run-to-run image variation that is not associated with wear. It may be used to maintain the integrity of the initial intensity to wear depth calibration. In an example, the average of three or four regions of the image without wear (e.g., TiC, alumina of the AlTiC and the unworn shield regions) may now be determined.

Next, as stated in step 212, in an embodiment, the thickness variation of the SEM images of the first region and the second region is again masked to obtain a refined two-dimensional black and white mask including the first region and the second region. In an alternative embodiment, this secondary masking is omitted.

As stated in step 214, in an embodiment, a surface profiler image of the first region and the second region is obtained. In an embodiment, atomic force microscope (AFM) images serve as the surface profiler images of the first region and the second region. In an embodiment, alternative surface profilers may be utilized including but not limited to: variations of AFM such as conductive atomic force microscopy and photoconductive atomic force microscopy, scanning force microscopy, alternative types of scanning probe microscopy, scanning tunneling microscopy, profilometers, and optical microscopy.

In an embodiment, step 214 and step 216 are performed once or a limited number times for the process cycle described in FIG. 2. That is, for example, surface profiler images (e.g., AFM images) are obtained once and may serve as a master calibration for numerous SEM images, rather than obtaining a surface profiler image for every SEM image, and overlaying and calibrating a new surface profiler image with every SEM image.

Next, as stated in step 216, an image intensity variation is determined between the masked SEM images of the first region and the second region by overlaying and calibrating the SEM images with the surface profiler images.

As stated in step 218, in an embodiment, the image intensity variation is converted to quantified thickness utilizing a fitted relation obtained from the calibration of the surface profiler images with the SEM images.

In an embodiment, SEM is additionally utilized to quantify area of thickness variation of the subject material.

Figure 3:
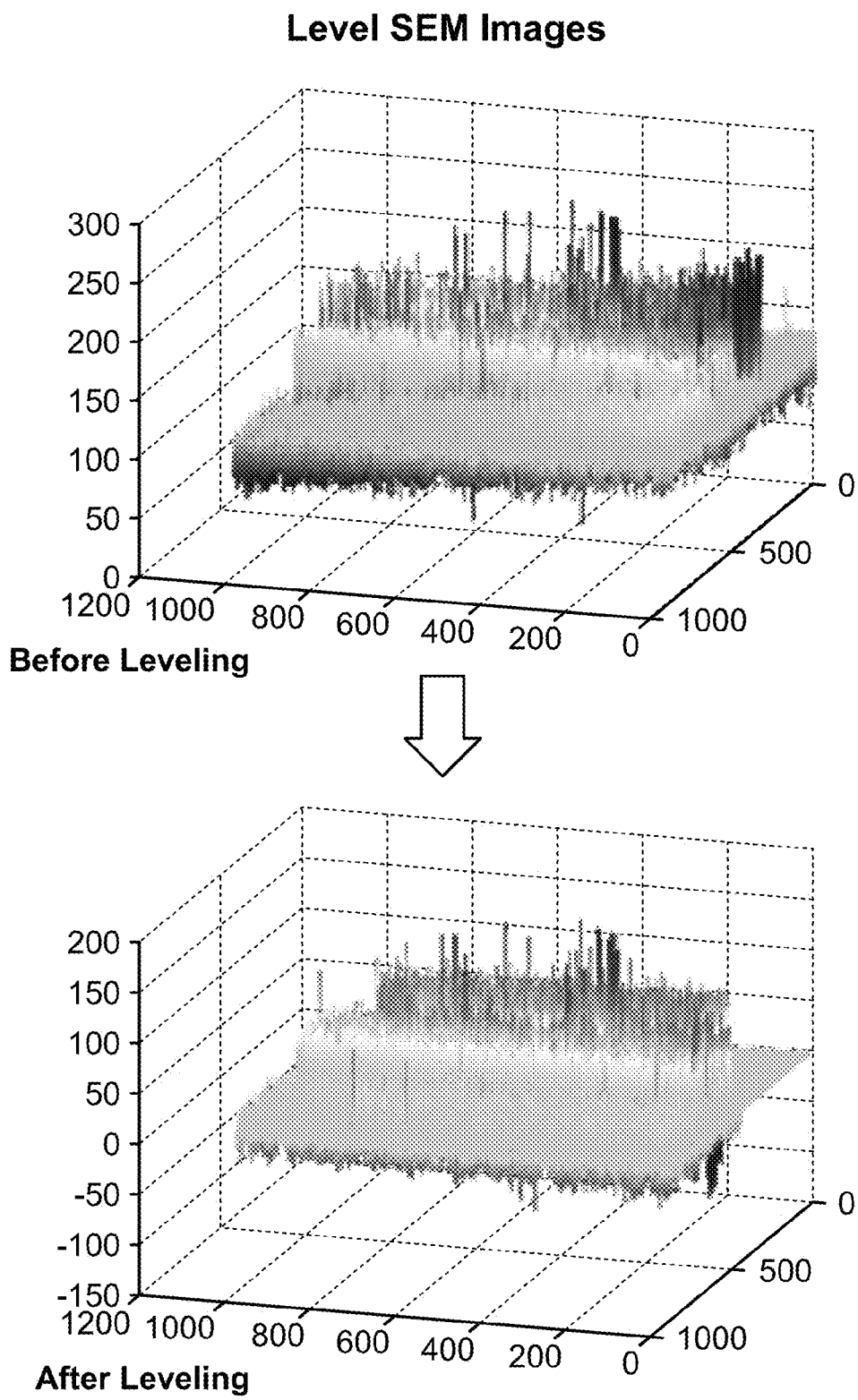
FIG. 3 is a representative graph illustrating experimental data of SEM images before background leveling, and after background leveling, in an embodiment.

Turning now to a representative graph, experimental data is provided to illustrate an example embodiment. Features of the discussion and claims are not limited to the example embodiment, which is used only for purposes of the example data. FIG. 3 illustrates an example of SEM images before background leveling, and after background leveling. As described in step 204 of FIG. 2, background leveling (e.g., to compensate for sample tilt) is applied to the SEM images by top-hat filtering the first region. Alternatively or additionally, background leveling of the SEM images is provided by two-dimensional spline fitting the wear region, and/or flat-frame calibration of the first region and a second region. The first region is for example a region having wear, and the second region is for example a region not having wear. At least some areas of the first region are less thick than the second region.

Flat-frame calibration or flat-field correction is a calibration procedure used to improve quality in digital imaging. It removes artifacts from 2-D images caused by variations in the pixel-to-pixel sensitivity of the detector and/or by distortions in the optical path. Flat fielding compensates for different gains and dark currents in a detector. Once a detector has been appropriately flat-fielded, a uniform signal creates a uniform output. Thus, any further signal is due to the phenomenon being detected and not a systematic error.

In an embodiment, background leveling, wear masking of wear and non-wear regions, and/or contrast normalization is not utilized. Here, sources of variation are controlled in an application. For example, the second region (e.g., region not having wear) may have consistent image intensity, and so contrast normalization may be unneeded. In this embodiment, a method detects thickness variation of a subject material. Images are obtained of a first region of the subject material and a second region of the subject material utilizing scanning electron microscopy (SEM). The SEM images are image processed to obtain a differential contrast between the first region and the second region. The first region has less thickness than the second region, the subject material is overlying a second material, and the image processing utilizes the second material to differentially contrast the first region from the second region. Image intensity variation is determined between the masked SEM images of the first region and the second region by obtaining a surface profiler image of the first region and the second region, and overlaying and calibrating the SEM images with the surface profiler images. In a further embodiment, image intensity variation is converted to quantified thickness utilizing a fitted relation obtained from the calibration of the surface profiler images with the SEM images.

Figure 4:
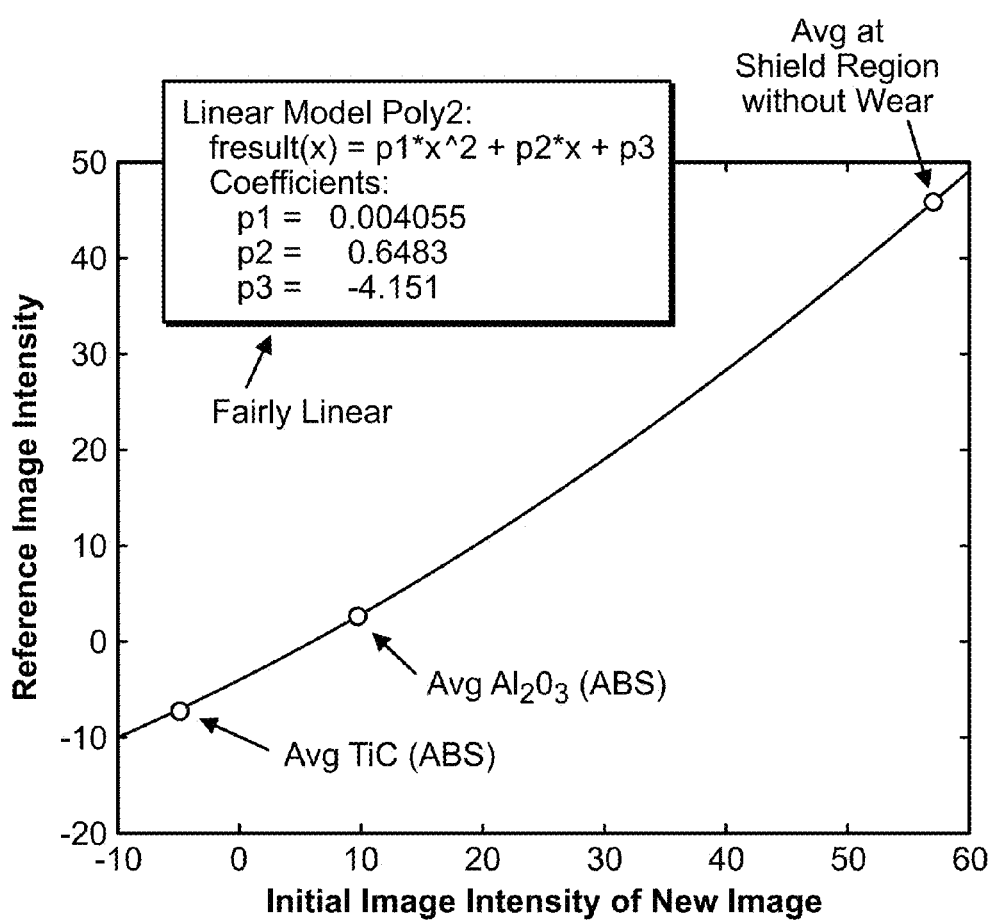
FIG. 4 is a representative graph illustrating experimental data of image intensities mapping for contrast normalization, in an embodiment.

FIG. 4 is a representative graph illustrating experimental data of image intensities mapping for contrast normalization. A newly acquired series of the SEM images of the second region are compared with an intensity of a reference image of the second region. Linear or low-order fitting may be utilized to map the intensities. As described in step 210 of FIG. 2, contrast variation between a series of SEM images of the second region is normalized. The first region is for example a region having wear, and the second region is for example a region not having wear. At least some areas of the first region are less thick than the second region.

Contrast normalization may be utilized for a wide variety of factors including variation of parameters, drift, or the effectiveness of sample grounding to the SEM. Additionally, in an embodiment, contrast normalization may be utilized on a surface with uniform wear depth.

Figure 5:
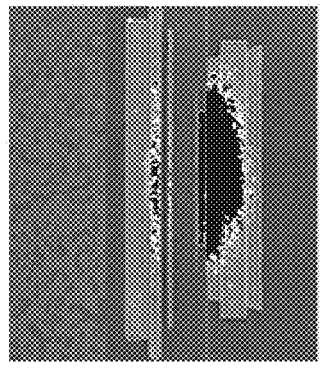
FIG. 5 are representative graphs illustrating experimental output of a pre-processed SEM image, a SEM mask of wear, points of detected wear, and a wear map, in an embodiment.
Figure 5:
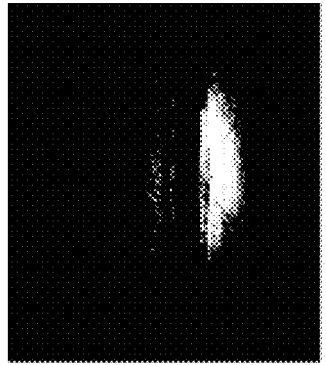
Figure 5:
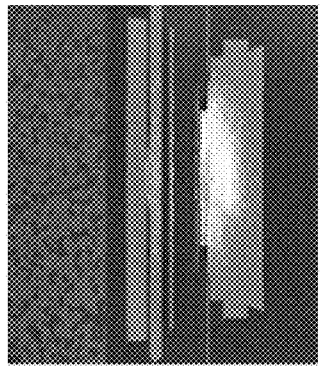
Figure 5:
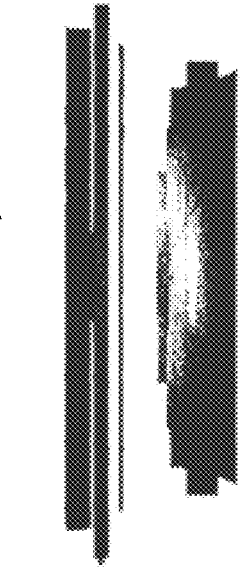
Figure 5:
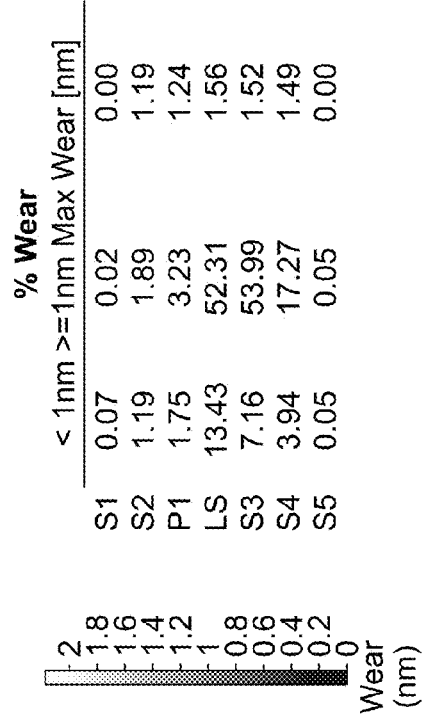

Turning now to FIG. 5, an example embodiment output of a pre-processed SEM image, a SEM mask of wear, points of detected wear, and a wear map is illustrated. The SEM images show a portion of a magnetic head of a HDD with surface wear, and a shield without wear. A diamond-like carbon (DLC) layer is a protective film that is formed on the surfaces of these regions of the head as a tribological and corrosion barrier for the head.

The top left image shows a SEM image of the magnetic head that is preprocessed, as in an embodiment of the invention as described in FIG. 2, steps 204 and 206.

The top middle image shows a two-dimensional black and white masked SEM image of the magnetic head after masking thickness variation between the DLC surface with wear and the DLC surface without wear, as in an embodiment of the invention as described in FIG. 2, step 208. The masked SEM image reveals regions of the magnetic head that are less thick than other regions of the magnetic head. In this example, the wear identified is wear to the overlying DLC layer. The wear regions appear in white. The shield shows no wear. In this example, the shield is a NiFe alloy that appears as the same intensity. Since Ni and Fe are close in atomic number, a change in mixture ratio minimally affects SEM compositional intensity. A histogram of the image with and without wear may be used to threshold the image and segment the region with wear from the region without wear.

The top right image is another SEM image showing regions of detected wear of the magnetic head, and image intensity variation in regions delineated by the wear mask.

The bottom left image is a wear map showing quantified wear depth in terms of nanometers of the magnetic head. The quantified wear depth is provided as described in FIG. 2, steps 212-218, after converting the image intensity variation to a quantified thickness utilizing a fitted relation obtained from overlaying and the calibrating AFM images of the magnetic head with SEM images of the magnetic head. The wear map quantifies, in nanometers, wear regions of the magnetic head. In this example, the wear identified is wear to the overlying DLC layer. In an embodiment, the fitted relation is a relationship between AFM values and SEM intensity. In an example, the AFM values are in units of nanometers, and the SEM is defined in terms of a matrix of intensity values in 256 levels of gray scale corresponding to wear depth. The relationship between AFM values and SEM intensity may be linear, quadratic, polynomial, etc.

Figure 6:
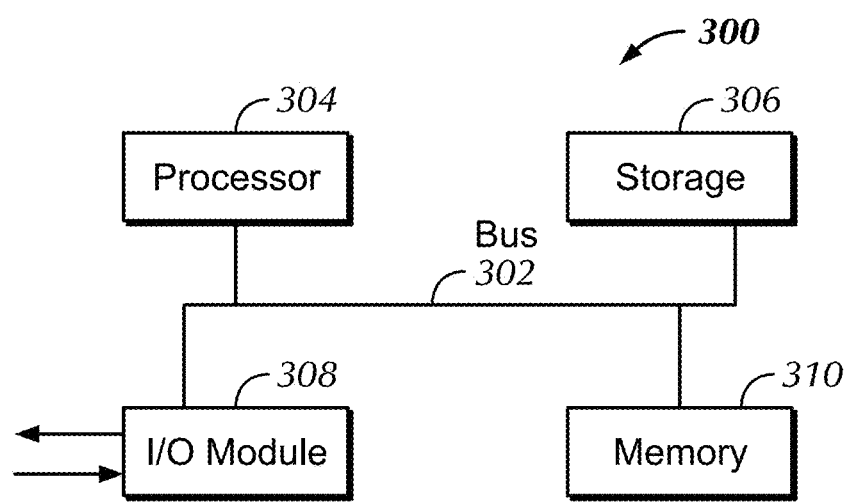
FIG. 6 is a sectional view representation illustrating components of a system that executes methods of an embodiment.

FIG. 6 illustrates components of system 300, in an embodiment. System 300 includes processor module 304, storage module 306, input/output (I/O) module 308, memory module 310, and bus 302. Although system 300 is illustrated with these modules, other suitable arrangements (e.g., having more or less modules) known to those of ordinary skill in the art may be used. For example, system 300 may be a logic implemented state machine or a programmable logic controller.

In an embodiment, the methods described herein are executed by system 300. Specifically, processor module 304 executes one or more sequences of instructions contained in memory module 310 and/or storage module 306. In one example, instructions may be read into memory module 310 from another machine-readable medium, such as storage module 306. In another example, instructions may be read directly into memory module 310 from I/O module 308, for example from an operator via a user interface. Information may be communicated from processor module 304 to memory module 310 and/or storage module 306 via bus 302 for storage. In an example, the information may be communicated from processor module 304, memory module 310, and/or storage module 306 to I/O module 308 via bus 302. The information may then be communicated from I/O module 308 to an operator via the user interface.

Memory module 310 may be random access memory or other dynamic storage device for storing information and instructions to be executed by processor module 304. In an example, memory module 310 and storage module 306 are both a machine-readable medium.

In an embodiment, processor module 304 includes one or more processors in a multi-processing arrangement, where each processor may perform different functions or execute different instructions and/or processes contained in memory module 310 and/or storage module 306. For example, one or more processors may execute instructions for image processing SEM images, and one or more processors may execute instructions for input/output functions. Also, hard-wired circuitry may be used in place of or in combination with software instructions to implement various example embodiments. Thus, embodiments are not limited to any specific combination of hardware circuitry and software.

The term "circuit" or "circuitry" as used herein includes all levels of available integration, for example, from discrete logic circuits to the highest level of circuit integration such as VLSI, and includes programmable logic components programmed to perform the functions of embodiments as well as general-purpose or special-purpose processors programmed with instructions to perform those functions.

Bus 302 may be any suitable communication mechanism for communicating information. Processor module 304, storage module 306, I/O module 308, and memory module 310 are coupled with bus 302 for communicating information between any of the modules of system 300 and/or information between any module of system 300 and a device external to system 300. For example, information communicated between any of the modules of system 300 may include instructions and/or data.

The term "machine-readable medium" as used herein, refers to any medium that participates in providing instructions to processor module 304 for execution. Such a medium may take many forms, including, but not limited to, non-volatile media, and volatile media. Non-volatile media includes, for example, optical or magnetic disks, such as storage module 306. Volatile media includes dynamic memory, such as memory module 310. Common forms of machine-readable media or computer-readable media include, for example, floppy disk, a flexible disk, hard disk, magnetic tape, any other magnetic medium, a CD-ROM, DVD, any other optical medium, punch cards, paper tape, any other physical mediums with patterns of holes, a RAM, a PROM, an EPROM, a FLASH EPROM, any other memory chip or cartridge, or any other medium from which a processor can read.

In an embodiment, a non-transitory machine-readable medium is employed including executable instructions for detecting thickness variation of a subject material.

The instructions include code for obtaining images of a first region and a second region of a subject material, utilizing a scanning electron microscopy (SEM), and image processing the SEM images to obtain a differential contrast between the first region and the second region. The first region has less thickness than the second region. The subject material is overlying a second material. The image processing utilizes the second material to differentially contrast the first region from the second region. The instructions further include code for determining image intensity variation between the masked SEM images of the first region and the second region by obtaining a surface profiler image of the first region and the second region, and overlaying and calibrating the SEM images with the surface profiler images. In an embodiment, the surface profiler images are obtained once or a limited number of times and may serve as a master calibration for numerous SEM images, rather than obtaining a surface profiler image for every SEM image, and overlaying and calibrating a new surface profiler image with every SEM image.

In an embodiment, the subject material is at least a portion of a magnetic read head overcoat and/or write head overcoat. In an embodiment, the subject material is a surface of a data storage disk facing an air bearing surface. In an embodiment, the differential contrast is due to differential wear between the first region and the second region of the magnetic read head overcoat and/or write head overcoat, wherein the overcoat is diamond-like carbon. In an embodiment, the non-transitory machine-readable medium further includes executable instructions for background leveling the SEM images by top-hat filtering the first region, two-dimensional spline fitting the first region, and/or flat-frame calibration the first and second region. In an embodiment, the non-transitory machine-readable medium further includes executable instructions for masking thickness variation of the SEM images of the first region and the second region, to obtain a two-dimensional black and white mask including the first region and the second region. In an embodiment, the non-transitory machine-readable medium further includes executable instructions for normalizing contrast variation between a series of SEM images of the second region by mapping an intensity of the series of SEM images of the second region utilizing linear or low-order fitting, and comparing the series of the SEM images of the second region with an intensity of a reference image of the second region. In an embodiment, the non-transitory machine-readable medium further includes executable instructions for secondary masking the thickness variation of the SEM images of the first region and the second region, to obtain a refined two-dimensional black and white mask including the first region and the second region. In an embodiment, the surface profiler images are atomic force microscope (AFM) images of the first region and the second region. In an embodiment, the non-transitory machine-readable medium further includes executable instructions for converting image intensity variation to quantified thickness utilizing a fitted relation obtained from the calibration of the surface profiler images with the SEM images. In an embodiment, the non-transitory machine-readable medium further includes executable instructions for utilizing SEM to quantify area of thickness variation of the subject material.

Figure 7:
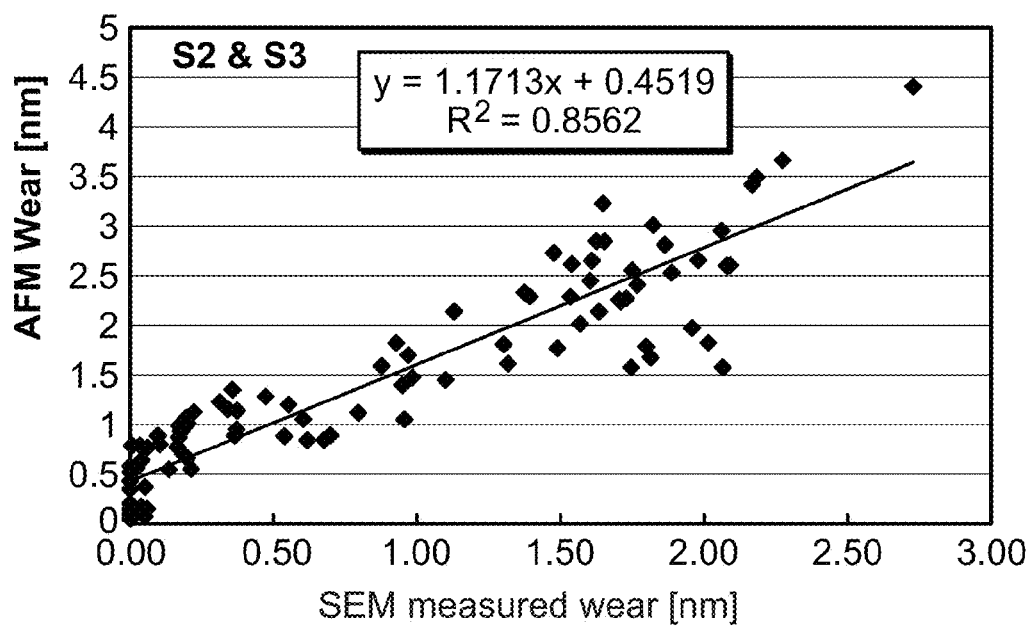
FIG. 7 is a representative graph illustrating experimental data of quantitative wear for example HDD shields, in an embodiment.

Referring to FIG. 7, a representative graph illustrates experimental data of quantified wear for example shields S2 and S3, from a Matlab based algorithm, in an embodiment. Features of the discussion and claims are not limited to the example embodiment, which is used only for purposes of the example data. In an embodiment, other programming besides Matlab may be utilized.

Sliders with varying degrees of wear from tribological constant overwrite testing were used. Manual AFM measurements of wear obtained prior to SEM show acceptable correlation with the degree of wear calculated from an SEM images process embodiment described above. Correlation with manual AFM measurements also shows acceptable correlation.

The images shown are 8-bit SEM images. If error is observed in a particular regime due to a number of pixels in the SEM images being saturated, consequently slightly overestimating the wear amount from SEM images, 16-bit SEM images may alternatively be utilized to reduce the error.

The linear equation is shown, and the r-squared value is calculated at 0.8562, which is a statistical value describing the accuracy (scale 0.0 to 1.0) that one term can be used to predict the value of another term. The r-squared value shows acceptable accuracy for particular embodiments in assessing quantitative wear depth for a magnetic head for a data storage device.

Modifications and variations may be made to the disclosed embodiments while remaining within the spirit and scope of the method, system and apparatus. The implementations described above and other implementations are within the scope of the following claims.

We claim:

1. A method for detecting thickness variation of a subject material for a data storage system comprising:
   i.) obtaining images of a first region of the subject material and a second region of the subject material utilizing scanning electron microscopy (SEM), wherein the subject material is a material of the data storage system;
   ii.) image processing the SEM images to obtain a differential contrast between the first region and the second region, wherein: a.) the first region has less thickness than the second region; b.) the subject material is overlying a second material; and c.) the image processing utilizes the second material to differentially contrast the first region from the second region; and
   iii.) determining image intensity variation between the masked SEM images of the first region and the second region by obtaining a surface profiler image of the first region and the second region, and overlaying and calibrating the SEM images with the surface profiler images.

2. The method as in claim 1, wherein the subject material is one of:
   i.) at least a portion of a magnetic read head overcoat and/or write head overcoat, wherein the overcoat is diamond-like carbon; and
   ii.) a surface of a data storage disk facing an air bearing surface.

3. The method as in claim 1, further comprising background leveling the SEM images by at least one of:
   i.) top-hat filtering the first region;
   ii) two-dimensional spline fitting the first region; and
   iii.) flat-frame calibration the first and second region.

4. The method as in claim 1, further comprising masking thickness variation of the SEM images of the first region and the second region, to obtain a two-dimensional black and white mask including the first region and the second region.

5. The method as in claim 4, further comprising normalizing contrast variation between a series of SEM images of the second region by mapping an intensity of the series of SEM images of the second region utilizing linear or low-order fitting, and comparing the series of the SEM images of the second region with an intensity of a reference image of the second region.

6. The method as in claim 5, further comprising secondary masking the thickness variation of the SEM images of the first region and the second region, to obtain a refined two-dimensional black and white mask including the first region and the second region.

7. The method as in claim 1, wherein the surface profiler images are atomic force microscope (AFM) images of the first region and the second region.

8. The method as in claim 1, further comprising converting image intensity variation to quantified thickness utilizing a fitted relation obtained from the calibration of the surface profiler images with the SEM images.

9. A method to quantify magnetic read and/or write head tribological wear depth, for a data storage system comprising:
   i.) obtaining images of a first region of the magnetic head and a second region of the magnetic head utilizing scanning electron microscopy (SEM);
   ii.) background leveling the SEM images;
   iii.) image processing the SEM images to obtain a differential contrast between the first region and the second region, wherein: a.) the first region has less thickness than the second region; b.) the magnetic head is overlying a second material; and c.) the image processing utilizes the second material to differentially contrast the first region from the second region;
   iv.) masking thickness variation of the SEM images of the first region and the second region, to obtain a two-dimensional black and white mask including the first region and the second region;
   v.) determining image intensity variation between the masked SEM images of the first region and the second region by obtaining a surface profiler image of the first region and the second region, and overlaying and calibrating the SEM images with the surface profiler images; and
   vi.) converting image intensity variation to quantified thickness utilizing a fitted relation obtained from the calibration of the surface profiler images with the SEM images.

10. The method as in claim 9, wherein the surface profiler images are atomic force microscope (AFM) images of the first region and the second region.

* * * * *